Sept. 11, 1962 S. T. MEYERS 3,054,000

BINARY COUNTER EMPLOYING MULTIREGION BISTABLE SEMICONDUCTIVE DEVICES

Filed Aug. 5, 1960

INVENTOR
S. T. MEYERS

BY R. B. Ardis

ATTORNEY

United States Patent Office 3,054,000 Patented Sept. 11, 1962

3,054,000

BINARY COUNTER EMPLOYING MULTIREGION BISTABLE SEMICONDUCTIVE DEVICES

Stanley T. Meyers, East Orange, N.J., assignor to Bell Telephone Laboratories, Incorporated, New York, N.Y., a corporation of New York Filed Aug. 5, 1960, Ser. No. 47,755
6 Claims. (Cl. 307—88.5)

This invention relates generally to binary counters and more particularly to binary counters employing junction type semiconductive devices as active elements.

It is an object of this invention to reduce the number of active elements required in junction transistor binary counters.

It is another object of this invention to eliminate the need for permanent memory storage devices in junction transistor binary counters employing a single transistor.

It is a further object of this invention to reduce the gating circuit requirements for multistage counters.

In the past some junction transistor binary counters have employed at least two transistors together with rather complex coupling circuitry between the transistors. Other junction transistor binary counters, while requiring only a single transistor, have had to depend for their operation upon the presence of one or more permanent memory storage devices. While generally satisfactory, all of these junction transistor circuits have tended to be somewhat limited in their application because of the complexity of the circuits involved.

The point contact transistor has been employed in single transistor binary counter circuits, but this type of transistor tends to be limited in application due to the heavy requirements imposed for shifting from the high current state to the low current state. When the point contact transistor is operating in its high current state, the transition back to its low current state is not regenerative in nature. In order for the transistor to be shifted to its low current state, therefore, an input pulse must be applied to the base-emitter circuit of sufficient magnitude to entirely cancel the base-emitter current which is flowing. This necessity for relatively high biasing voltages and currents, however, may cause interaction between the stages of a multistage counter employing such point contact transistor binary counters unless complicated and expensive coupling circuitry is used between the stages.

In accordance with this invention input pulses, which are to be counted, alternately drive a multilayer semiconductive device having two stable states of equilibrium from one of its stable states to the other of its stable states. The multilayer semiconductive device may be the avalanche transistor described by S. L. Miller and J. J. Ebers in "Alloyed Junction Avalanche Transistors," vol. 34, Bell System Technical Journal, September 1955, page 883. The avalanche transistor can assume either of two D.-C. states when the collector-emitter supply voltage exceeds a predetermined breakdown voltage. A first input pulse of the right polarity injects current into the base-emitter circuit of the avalanche transistor biasing the internal base-emitter junction in the forward direction. The internal collector-emitter path of the avalanche transistor is thereby switched to its low impedance condition causing a relatively high current to flow in the collector-emitter circuit. The current in the collector-emitter circuit flows even after the forward bias is removed from the base-emitter junction, and continues to flow until a reverse bias is applied by the action of a second input pulse. The second input pulse causes a reverse current to be injected into the base-emitter circuit to provide a reverse bias, and because the transition back to the low current state is regenerative in nature, this current may be small in comparison with the collector-emitter current and still cause the collector-emitter current to diminish to a relatively low value.

The multilayer semiconductive device may also be a silicon P–N–P–N triode transistor of the type described by I. M. Mackintosh in his article "The Electrical Characteristics of Silicon P–N–P–N Triodes," which appeared in the Proceedings of the I.R.E., vol. 46, June 1958, at page 1229. Although the terminology used in the art is not fully consistent since such a transistor possesses three junctions instead of the usual two, the usual transistor electrode nomenclature can still be employed. Thus, since one of the outer junctions draws current from the external circuit in the manner of the usual emitter electrode, it is, in the context of the present application, called the emitter. Similarly, since the other outer junction passes current on to the external circuit in the manner of the usual collector electrode, it is called the collector in the present application. The electrode attached to the body of the transistor between the emitter and collector junctions is, as usual, called the base.

Like the avalanche transistor, the silicon P–N–P–N triode can assume either of two D.-C. states when the supply voltage connected between the two outer regions or layers (i.e., between the emitter and the collector) exceeds the breakdown point. With such a supply voltage, a pulse of the proper polarity can inject current into the base and switch the internal emitter-collector path of the device into its low impedance condition, causing a relatively high current to flow in that path. This current continues to flow even after the pulse at the base is removed and ceases only when current of the opposite polarity is injected into the base. Because the transition back to the low current state is cumulative in nature, this reverse current pulse may be quite small in comparison with the current flowing in the internal emitter-collector current path between the outer layers or regions of the transistor.

The invention will be more fully comprehended from the following detailed description, taken in conjunction with the drawings, in which.

Figure 1:
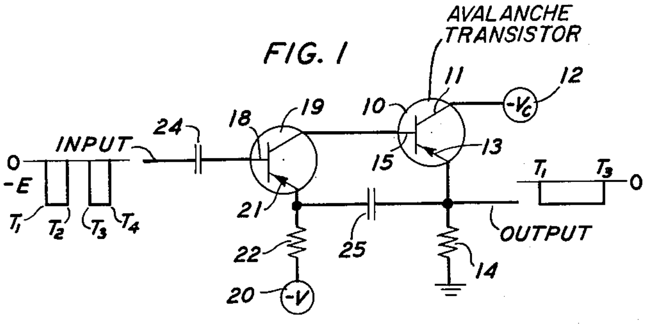
FIG. 1 is a schematic diagram of one binary counter embodying the invention.

A first embodiment of the invention employing an avalanche transistor 10, whose characteristics are described in the above-mentioned article by Miller and Ebers, connected in the emitter-follower configuration, is shown in FIG. 1. The avalanche transistor 10 shown in FIG. 1 is of the P–N–P type, and the collector 11 is connected to a source 12 of negative voltage, which exceeds the collector-emitter breakdown voltage, with the emitter 13 connected to ground by means of a resistor 14. Under these circumstances a negative voltage applied to the base 15 of the transistor 10 will forward bias the base-emitter junction and cause the avalanche transistor to assume its high current state. A relatively high value of collector-emitter current will flow and this current flows even after the forward bias is removed and continues to flow until a reverse bias is applied to the base-emitter circuit. A positive voltage applied to the base 15 will serve to reverse bias the base-emitter junction and cause the transistor 10 to assume its low current state.

The embodiment of the invention shown in FIG. 1 counts negative input pulses which are shown to the left of FIG. 1. In such a case the input pulses are applied to the base 18 of a P–N–P type transistor switch 19. Each negative pulse is greater in magnitude than the negative voltage supplied by source 20 to the emitter 21 of transistor switch 19 by means of resistor 22. The base-emitter junction is, therefore, forward biased by each negative input pulse and the transistor switch 19 closes. The circuit shown may be made to count positive input pulses by the simple expedient of using an N–P–N type switch transistor in combination with an N–P–N type avalanche transistor and reversing the polarities of all the biasing voltage sources, or by simply using an N–P–N type switching transistor 10 and reversing the polarity of source 20.

The input pulses of negative polarity to be counted are applied to the base 18 of the transistor switch 19 by means of a coupling capacitor 24. Feedback is provided from the emitter 13 of the avalanche transistor 10 to the emitter 21 of the switching transistor 19 by means of a storage capacitor 25. Initially both transistors are in the off condition, that is they are not conducting. Under such conditions the voltage at the left-hand terminal of capacitor 25 is negative with respect to its right-hand terminal and equal to that of source 20. When a negative pulse is applied to the base 18 of transistor 19 by means of capacitor 24, transistor 19 conducts with the length of time that the transistor conducts determined by the time constant of coupling capacitor 24, together with the effective resistance of the conducting transistor. The closure of transistor switch 19 causes the negative voltage which was on the storage capacitor 25 to be applied to the base 15 of avalanche transistor 10, and forward biases the P–N–P type avalanche transistor 10 causing a relatively high saturation current to flow in the collector-emitter circuit. The magnitude of the saturation current is dependent upon the magnitude of the collector-emitter supply voltage 12 and the emitter circuit resistance 14.

The application of the first negative input pulse to the counter causes the capacitor 24 to charge and when the charge voltage is equal to the input voltage the switching transistor 19 no longer conducts. The high current in the collector-emitter circuit of the avalanche transistor results in a high emitter-ground voltage across resistor 14 which places a voltage across capacitor 25 opposite in polarity to the voltage which existed across that capacitor before the application of an input pulse to the counter. That is, the left-hand terminal of capacitor 25 is now positive in voltage with respect to its right-hand terminal. Because of the current drain on the capacitor 24 by the switching transistor 19 between input pulses, the charge which existed on capacitor 24 as a result of the application of the first input pulse is dissipated during the time between pulses, and the application of a second input pulse causes transistor 19 to close a second time. The left-hand terminal of capacitor 25 is now positive with respect to its right-hand terminal and the base-emitter circuit of transistor 10 is, therefore, reverse biased. Because the base of an avalanche transistor in the high current condition continues to control the current in the collector-emitter path, negative feedback takes place and the voltage and current requirements for changing from the high current to the low current state are very small, with the result that the counter shown in FIG. 1 may be cascaded to form a multistage counter without the necessity for expensive coupling circuitry. With relatively little current flowing in the collector-emitter circuit of the avalanche transistor the emitter-ground voltage across resistor 14 is now close to zero, and capacitor 25 assumes the same voltage and polarity that it had before the application of the first pulse to the counter and the above-described process repeats itself.

The output from the counter shown in FIG. 1 is taken from a direct connection to the emitter 13 of the avalanche transistor. It should be noted that the output could also be taken by a direct connection from the collector 11, in which case source 12 would be connected to the collector by a resistor, and the polarity of the output would be opposite that shown in the figure.

Figure 2:
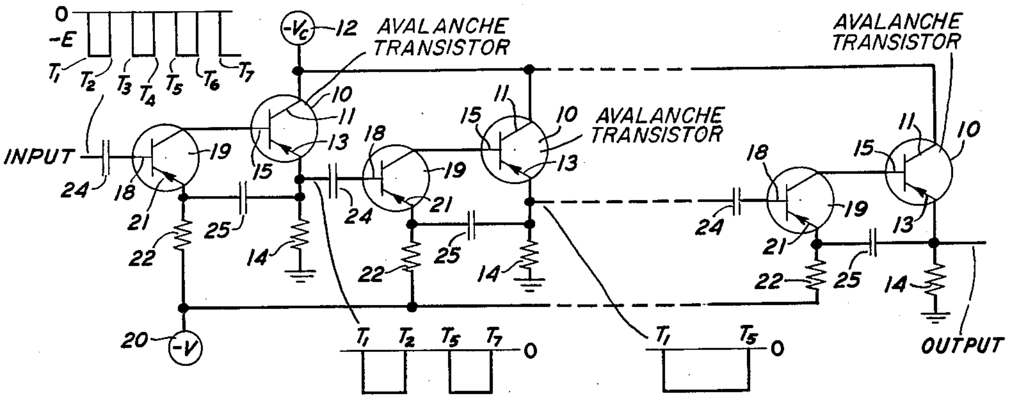
FIG. 2 is a schematic diagram of a multistage counter embodying the invention.

FIG. 2 shows an embodiment of the invention in the form of a multistage counter using several stages of the type illustrated in FIG. 1. The emitter 13 of one avalanche transistor 10 is connected to the base 18 of the switching transistor 19 of the following stage by means of coupling capacitor 24. Since each binary counter stage generates one output pulse for every two input pulses the outputs indicated at the emitter 13 in FIG. 2 show the behavior of the device. The stages may, of course, be cascaded to form a multistage counter by connecting the collector 11 of a preceding stage to the base 18 of the switching transistor of the succeeding stage by means of coupling capacitor 24.

Figure 3:
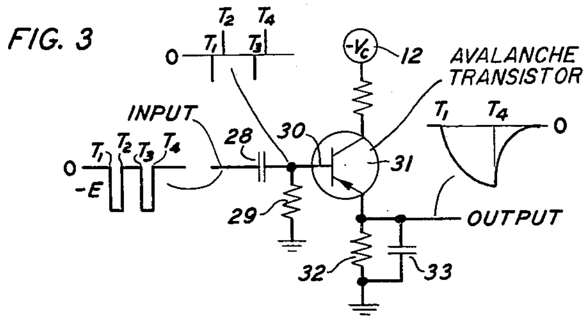
FIG. 3 is a schematic diagram of a second binary counter embodying the invention.

An alternative type binary counter embodying the invention is shown in FIG. 3. Here negative pulses are applied via a differentiator circuit, made up of capacitor 28 and resistor 29, to the base 30 of an avalanche transistor 31 connected in the common emitter configuration. For each negative pulse applied to the differentiating circuit there results a short negative spike followed immediately by a short positive spike at the base 30 of the avalanche transistor 31. If the avalanche transistor 31 is in its low current state when the first negative spike is applied to the base 30 then that short negative spike causes avalanche transistor 31 to assume its high current state. The saturation current in the collector-emitter circuit is initially high, but the voltage across the parallel combination of resistor 32 and capacitor 33 connected between the emitter and ground is close to zero because the voltage across the capacitor cannot change instantaneously. There is relatively little negative feedback in this initial phase. The short positive spike which immediately follows the first short negative spike is therefore unable to turn the avalanche transistor off because of the relatively high current required. The next appearing positive spike at the base 30 of the transistor 31, however, is sufficient to turn the transistor off since by the time that spike appears the emitter-ground voltage has grown sufficiently to permit negative feedback current to assist in the turn-off process and allow the transistor to resume its low current state. The net result of the above-described operation is shown by the output waveform to the right of FIG. 3 in conjunction with the input waveform shown to the left of the figure. The net result is that an output pulse appears for every two input pulses.

The transistor shown in FIG. 3 is of the P–N–P type. If it is desired to count positive pulses the transistor should be of the N–P–N type.

The counters shown in FIGS. 1, 2 and 3 use an avalanche transistor as the multilayer semiconductive junction device. As described above, a silicon P–N–P–N triode transistor of the type described by I. M. Mackintosh in the above-mentioned article may be directly substituted for the avalanche transistor in the circuits shown with the base similarly controlling the condition of the internal path (between outer regions) of the device at all times, and with a minimum of base turn-off current required to switch to the low impedance state.

What is claimed is:

1. A binary counter comprising, in combination, a three terminal multiregion device having a first and a second terminal connected to the outer regions of said device, a base electrode, and a predetermined breakdown voltage between said first and second terminals, means supplying a voltage to said first and second terminals in excess of said breakdown voltage, a source of pulses to be counted, switching means whose input is connected to said source of pulses and whose output is connected to the base of said device to inject a forward current into the base of said device in response to a first pulse to cause said device to shift from its high impedance to its low impedance state so that a high current flows in the internal path between said first and second terminals, whereby said high current continues to flow independently of the continued presence of said forward current, and feedback means connected between said device and said switching means to inject a reverse current into said base in response to a second pulse to stop the flow of said high current in the internal path between said first and second terminals.

2. A binary counter comprising, in combination, an avalanche transistor having a predetermined collector-emitter breakdown voltage, a collector-emitter voltage supply for said transistor in excess of said collector-emitter breakdown voltage, a source of pulses to be counted, switching means whose input is connected to said source of pulses and whose output is connected to the base of said transistor to inject a first current of one polarity into the base-emitter circuit of said transistor in response to a first pulse to cause said transistor to shift from its high impedance to its low impedance state so that a high current flows in the collector-emitter circuit, whereby said high current continues to flow independently of the continued presence of said first current, and feedback means connected between said transistor and said switching means to inject a second current of a polarity opposite that of said first current into said base-emitter circuit in response to a second pulse to stop the flow of said high collector-emitter current.

3. A binary counter comprising, in combination, a P–N–P–N triode having an emitter electrode connected to a first outer region, a collector electrode connected to a second outer region, a base electrode, and a predetermined collector-emitter breakdown voltage, means supplying a collector-emitter voltage to said triode in excess of said breakdown voltage, a source of input pulses to be counted, switching means whose input is connected to said source of pulses and whose output is connected to the base of said triode to inject a first current of one polarity into the base of said triode in response to a first pulse to cause said triode to shift from its high impedance to its low impedance state so that a high current flows in the collector-emitter circuit, whereby said high current continues to flow independently of the continued presence of said first current, and feedback means connected between said triode and said switching means to inject a second current of a polarity opposite that of said first current into said base electrode in response to a second pulse to stop the flow of said high collector-emitter current.

4. A binary counter comprising, in combination, an avalanche transistor having a predetermined collector-emitter breakdown voltage, a collector-emitter voltage supply for said transistor in excess of said collector-emitter breakdown voltage, a source of pulses to be counted, a differentiator whose input is connected to said source of pulses and whose output is connected to the base of said transistor to inject a first current of one polarity into the base-emitter circuit of said transistor in response to a first pulse to cause said transistor to shift from its high impedance to its low impedance state so that a high current flows in the collector-emitter circuit of said transistor, whereby said high current continues to flow independently of the continued presence of said first current, and means to increase the emitter voltage of said transistor during the time interval between said first pulse and a second pulse, whereby the output of said differentiator in response to the second pulse injects a second current of the opposite polarity into said base-emitter circuit to stop the flow of said high collector-emitter current.

5. A binary counter comprising, in combination, a P–N–P–N triode having an emitter electrode connected to a first outer region, a collector electrode connected to a second outer region, a base electrode, and a predetermined collector-emitter breakdown voltage, means supplying a collector-emitter voltage to said triode in excess of said breakdown voltage, a source of input pulses to be counted, a differentiator whose input is connected to said source of pulses and whose output is connected to the base of said triode to inject a first current of one polarity into the base of said triode in response to a first pulse to cause said triode to shift from its high impedance to its low impedance state so that a high current flows in the collector-emitter circuit of said triode, whereby said high current continues to flow independently of the continued presence of said first current, and means to increase the emitter voltage of said triode during the time interval between said first pulse and a second pulse, whereby the output of said differentiator in response to said second pulse injects a second current of the opposite polarity into said base electrode to stop the flow of said high collector-emitter current.

6. A binary counter which comprises a first avalanche transistor having an emitter electrode, a collector electrode, a base electrode, and a predetermined collector-emitter breakdown voltage, means supplying a collector-emitter voltage to said first transistor in excess of said breakdown voltage, a second transistor having an emitter electrode, a collector electrode, and a base electrode, a direct-current path interconnecting the collector electrode of said second transistor with the base electrode of said first transistor, a storage capacitor connected between the emitter electrode of said second transistor and the emitter electrode of said first transistor, a dropping resistor connected between the emitter electrode of said first transistor and a predetermined reference potential, means for establishing a charge across said storage capacitor tending to bias the emitter-base junction of said first transistor in the reverse direction, and means to apply unidirectional pulses in sequence to the base electrode of said second transistor to bias the emitter-base junction of said second transistor in the forward direction, whereby the first pulse in sequence causes the charge on said storage capacitor to switch said first transistor from its nonconducting condition into its conducting condition, the resulting current through the collector-emitter path of said first transistor and said dropping resistor reverses the direction of the charge on said storage capacitor, and the second pulse in sequence causes the resulting charge to switch said first transistor back into its nonconducting condition.

References Cited in the file of this patent

UNITED STATES PATENTS

| | | |
|---|---|---|
| 2,531,076 | Moore | Nov. 21, 1950 |
| 2,981,852 | MacLean et al. | Apr. 25, 1961 |

OTHER REFERENCES

Applications and Circuit Design Notes; Solid State Products, Inc. (SSPI), Bulletin D410–02, 3–60.